(12) United States Patent
Baek

(10) Patent No.: US 7,763,491 B2
(45) Date of Patent: Jul. 27, 2010

(54) METHOD FOR MANUFACTURING IMAGE SENSOR

(75) Inventor: In-Cheol Baek, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 247 days.

(21) Appl. No.: 11/943,081

(22) Filed: Nov. 20, 2007

(65) Prior Publication Data

US 2008/0149975 A1 Jun. 26, 2008

(30) Foreign Application Priority Data

Dec. 20, 2006 (KR) ...................... 10-2006-0131441

(51) Int. Cl.
H01L 21/00 (2006.01)
(52) U.S. Cl. .................... 438/70; 438/73; 257/E27.133
(58) Field of Classification Search .................. 438/70, 438/73; 257/E27.133
See application file for complete search history.

(56) References Cited

U.S. PATENT DOCUMENTS

| 6,656,762 | B2* | 12/2003 | Kim | ........................... 438/70 |
| 7,279,763 | B2* | 10/2007 | Lee | .............................. 257/435 |
| 7,547,573 | B2* | 6/2009 | Wen et al. | ...................... 438/69 |
| 2006/0145216 | A1* | 7/2006 | Lee | ............................. 257/294 |
| 2006/0148123 | A1* | 7/2006 | Kim | ............................. 438/69 |
| 2006/0228826 | A1* | 10/2006 | Kim et al. | ...................... 438/60 |
| 2007/0166868 | A1* | 7/2007 | Ko et al. | ....................... 438/70 |

FOREIGN PATENT DOCUMENTS

KR 100504563 B1 7/2005

* cited by examiner

Primary Examiner—Jerome Jackson, Jr.
Assistant Examiner—Paul A Budd
(74) Attorney, Agent, or Firm—Sherr & Vaughn, PLLC

(57) ABSTRACT

A method of manufacturing an image sensor that may restrain the oxidization of a pad. A method of manufacturing an image sensor may include at least one of the following steps: Forming a photodiode structure including a pixel in an active region of a semiconductor substrate. Forming a conductive pad electrically connected the pixel in a peripheral region of the semiconductor substrate, where the peripheral region at least partially surrounds the active region. Forming a passivation layer with an opening exposing the pad on and/or over the photodiode structure. Covering the exposed pad with an etching prevention layer. Forming a color filter on and/or over the passivation layer corresponding to the pixel. Forming a microlens on and/or over the color filter. Removing the etching prevention layer from the pad.

10 Claims, 3 Drawing Sheets

METHOD FOR MANUFACTURING IMAGE SENSOR

The present application claims priority under 35 U.S.C. 119 to Korean Patent Application No. 10-2006-0131441 (filed on Dec. 20, 2006), which is hereby incorporated by reference in its entirety.

BACKGROUND

Some types of image sensors are semiconductor devices that convert an optical image into an electrical signal. Examples of semiconductor image sensors are charge-coupled devices (CCD) and complementary metal oxide semiconductor (CMOS) image sensors.

When manufacturing some types of image sensors, transistors and photodiodes may be formed in a semiconductor substrate and may be electrically connected. An insulating layer structure and lines may be formed on and/or over the transistors and the photodiodes. While the lines are formed, a pad may be formed that is connected to the transistor. The pad may be connected to a conductive wire. The pad may be exposed from the insulating layer structure to electrically connect the pad to the conductive wire. At least one color filter (e.g. including red, green, and blue colors) may be formed on and/or over the insulating layer structure. An overcoat layer may then be formed on and/or over the color filter. A photoresist film may be formed on and/or over the overcoat layer. A reflow process may be performed to form microlenses that are used to condense light onto the photodiodes.

However, during formation of a color filter and/or microlens, a pad of the image sensor may be exposed from the insulating layer structure. Accordingly, the surface of the pad may be oxidized during formation of a color filter and microlens, resulting in a contact between the pad and the conductive wire being weakened.

SUMMARY

Embodiments relate to a method of manufacturing an image sensor that restrains the oxidization of a pad. In embodiments, a method of manufacturing an image sensor includes at least one of the following steps: Forming a photodiode structure including a pixel in an active region of a semiconductor substrate. Forming a conductive pad electrically connected to the pixel in a peripheral region of the semiconductor substrate, where the peripheral region at least partially surrounds the active region. Forming a passivation layer with an opening exposing the pad on and/or over the photodiode structure. Covering the exposed pad with an etching prevention layer. Forming a color filter on and/or over the passivation layer corresponding to the pixel. Forming a microlens on and/or over the color filter. Removing the etching prevention layer from the pad.

DRAWINGS

Figure 1:
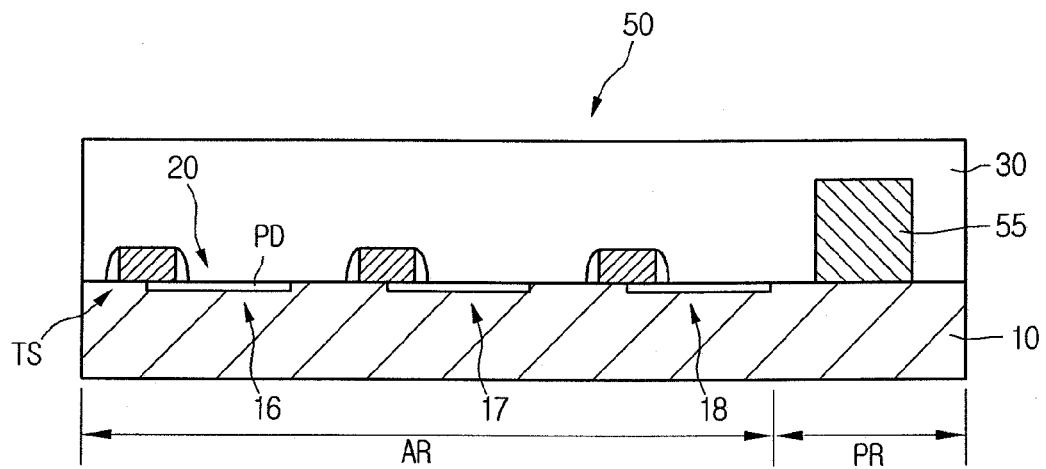

Example FIG. 1 illustrates a photodiode structure, in accordance with embodiments.

Figure 2:
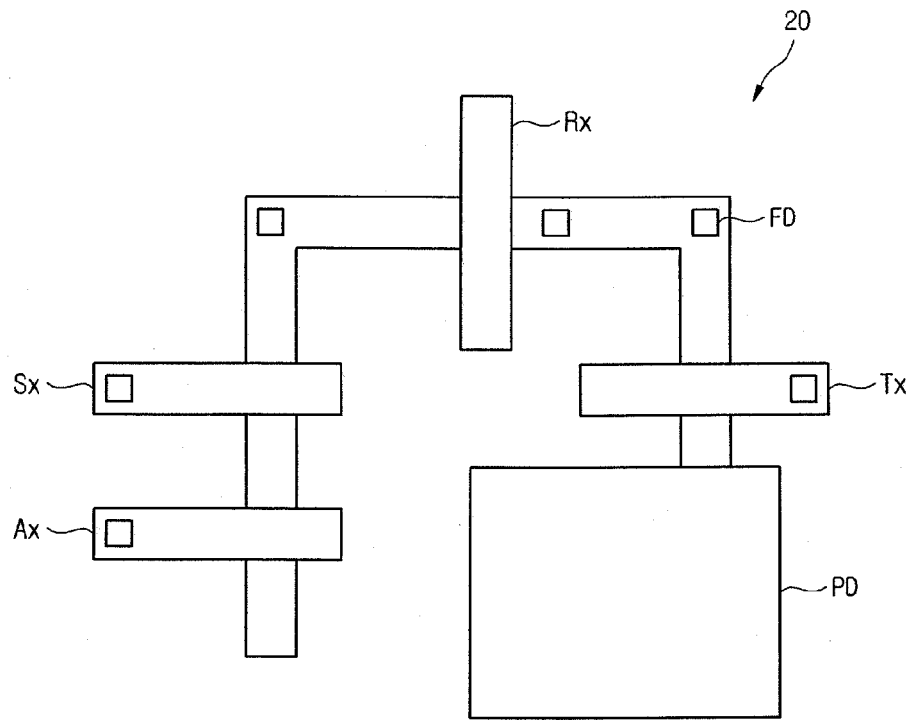

Example FIG. 2 illustrates a pixel of a photodiode structure, in accordance with embodiments.

Example FIGS. 3 to 6 illustrate a method of manufacturing an image sensor, in accordance with embodiments.

DESCRIPTION

Example FIG. 1 is a sectional view illustrating photodiode structure 50, according to embodiments. Example FIG. 2 is a plan view illustrating pixel 20 included in photodiode structure 50, in accordance with embodiments. Photodiode structure 50 may include pixels 20 and pad 55 and may be formed on and/or over semiconductor substrate 10. In embodiments, pixels 20 are formed in an active region AR of semiconductor substrate 10.

In embodiments, photodiode structure 50 includes pixels 20 and insulating layer structure 30. Pixels 20 may include a first pixel 16, a second pixel 17, and a third pixel 19. Each of the pixels 20 may include a photodiode PD and a transistor structure TS. Transistor structure TS may include a transfer transistor Tx, a reset transistor Rx, a select transistor Sx, and an access transistor Ax. The drain of the transfer transistor Tx may serves as a floating diffusion FD.

While pixels 20 are formed, pad 55 may be formed in peripheral region PR at least partially surrounding or formed around active region AR. Pad 55 may include metal (e.g. aluminum or an aluminum alloy) having a relatively low electric resistance. Pad 55 may be electrically connected to pixels 20. After pixels 20 and pad 55 are formed, insulating layer structure 30 may be formed on and/or over pixels 20 and/or pad 55. A line structure for driving pixels 20 may be formed in insulating layer structure 30. After insulating layer structure 30 is formed, passivation layer 60 may be formed on and/or over insulating layer structure 30. In embodiments, passivation layer 60 may be a silicon oxide (SiO2) layer.

Figure 3:
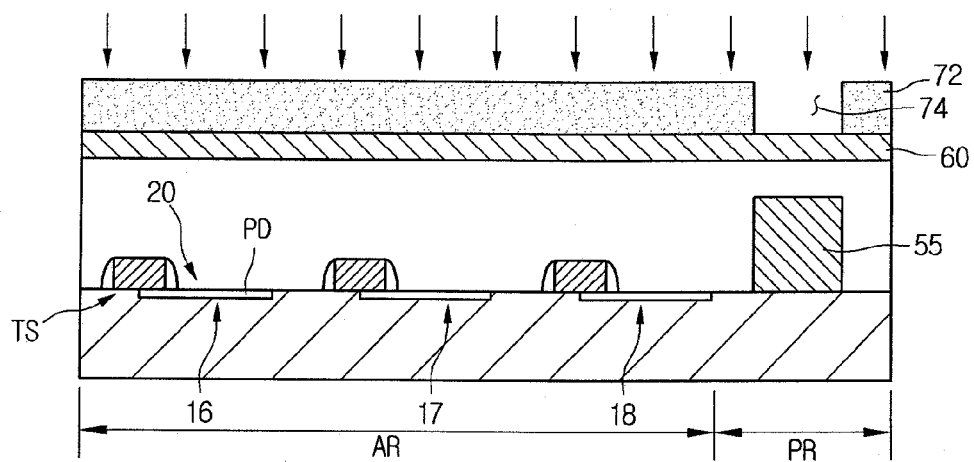

Example FIG. 3 is a sectional view illustrating a process of patterning passivation layer 60 and insulating layer structure 30, in accordance with embodiments. Example FIG. 4 is a sectional view illustrating etching prevention layer 80 formed on and/or over pad 55, in accordance with embodiments.

In embodiments, after passivation layer 60 is formed, a photoresist film is formed on and/or over passivation layer 60. In embodiments, a photoresist film may be formed by spin coating. A photoresist film may be patterned using a photo process (e.g. including an exposure process and a development process) resulting in photoresist pattern 72. Photoresist pattern 72 may be formed on and/or over passivation layer 60. An opening 74 may be formed in photoresist pattern 72 over pad 55.

Passivation layer 60 and/or insulating layer structure 30 may be etched using the photoresist pattern 72 as an etch mask to expose the top surface of pad 50. In embodiments, passivation layer 60 and/or insulating layer structure 30 may be patterned by reactive ion etching (RIE).

Figure 4:
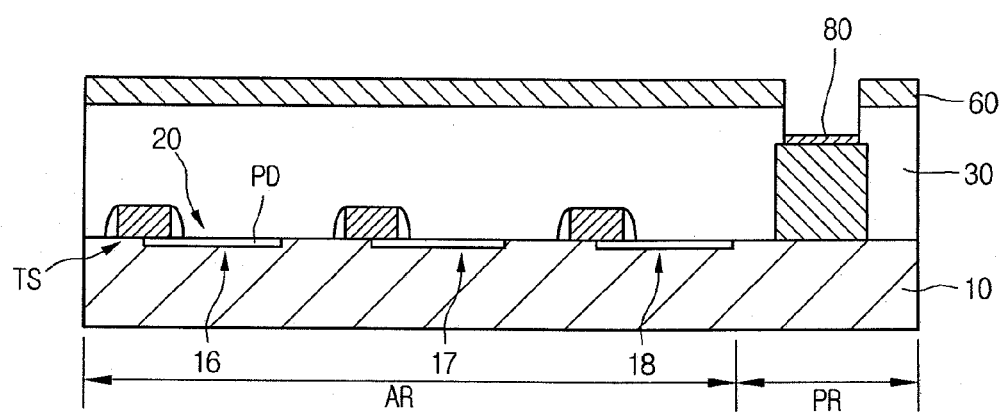

As illustrated in example FIG. 4, after passivation layer 60 and insulating layer structure 30 are etched to expose the top surface of pad 50, an etching prevention layer 80 may be formed on and/or over the exposed top surface of pad 50, in accordance with embodiments. In embodiments, etching prevention layer 80 may be formed by atomic layer deposition (i). In embodiments, etching prevention layer 80 may be formed using a atomic layer deposition process that includes ruthenium (Ru).

In embodiments, under predetermined temperature conditions, ruthenium may form etching prevention layer 80 on the pad 55 (which is metal), while not being deposited on passivation layer 60 (which may be an oxide layer). Accordingly, ruthenium may be selectively deposited on pad 55, thus preventing deposition on and/or over passivation layer 60, in accordance with embodiments. In embodiments, ruthenium may be selectively be deposited on pad 55 at a temperature ranging from approximately 150° C. to approximately 300° C. In embodiments, if the deposition temperature is less than approximately 150° C. or more than approximately 300° C., ruthenium may not be selectively deposited on pad 55 and inadvertently deposited on passivation layer 60. One of ordinary skill in the art will appreciate other metals and/or temperature ranges that may allow for selective deposition of metal on pad 55.

In embodiments, the thickness of the etching prevention layer 80 formed using the atomic layer deposition process may be in the range of approximately 50 Å to approximately 100 Å. Since the etching prevention layer 80 covers pad 50, a process of forming a color filter and/or microlenses does not etch or oxidize pad 50.

Figure 5:
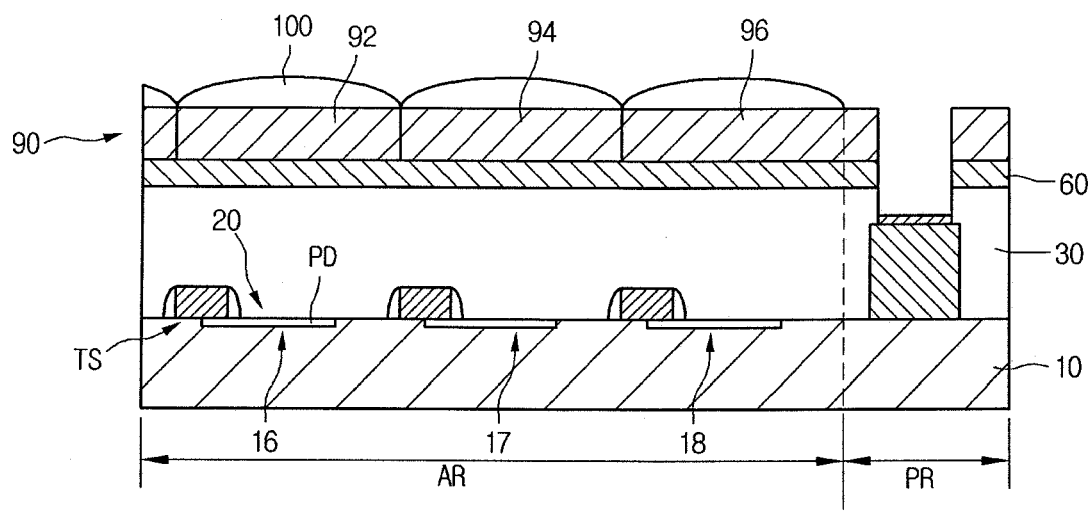

Example FIG. 5 is a sectional view illustrating a color filter and microlens structure formed on and/or over passivation layer 60, in accordance with embodiments. After etching prevention layer 80 is formed on and/or over pad 55, color filter 90 may be formed on and/or over passivation layer 60. Patterning a photoresist film (which may include a pigment or a dye) and a photosensitive substance may form color filter 90. Color filter 90 may include green color filter 92, red color filter 94, and blue color filter 96. However, one of ordinary skill in the art will appreciate other types of color filters for color filter 90. Green color filter 92 may be formed in a position corresponding to first pixel 16 (e.g. green color filter 92 may be formed over first pixel 16). Red color filter 94 may be formed in a position corresponding to second pixel 17 (e.g. red color filter 94 may be formed over second pixel 17). Blue color filter 96 may be formed in a position corresponding to third pixel 18 (e.g. blue color filter 96 may be formed over third pixel 18).

In embodiments, after color filter 90 is formed, an overcoat layer may be formed on and/or over color filter 90. An overcoat layer may compensate for height differences between different color filters of color filter 90. Microlenses 100 may be formed on and/or over color filter 90 (e.g. including green color filter 92, red color filter 94, and/or blue color filter 96), in accordance with embodiments. Microlens 100 may condense incident light onto photodiode PD of a photodiode structure, in accordance with embodiments.

Figure 6:
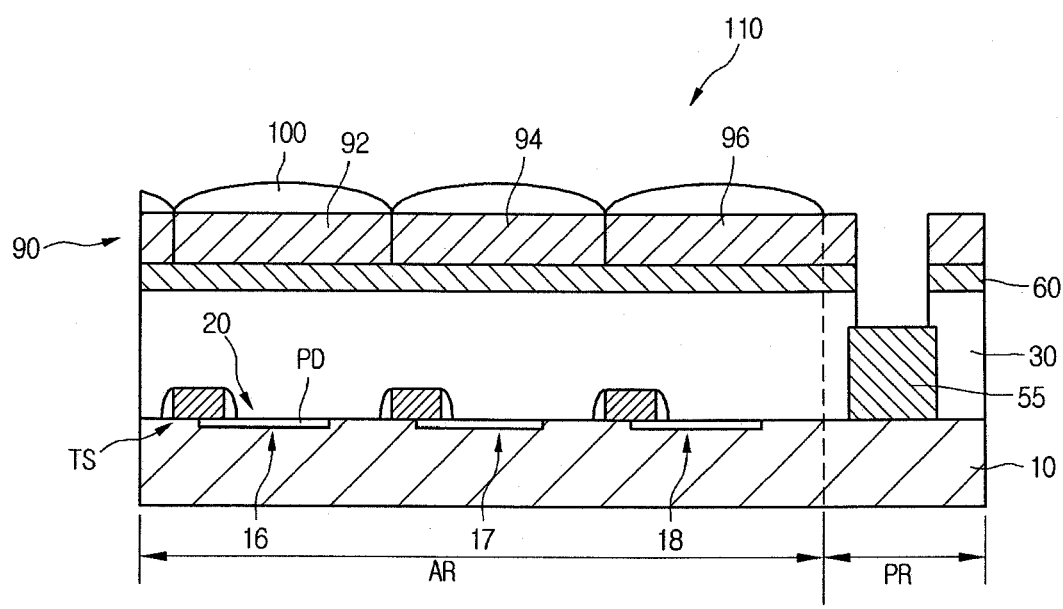

Example FIG. 6 is a sectional view illustrating image sensor 110 after removing etching prevention layer 80, in accordance with embodiments. After microlenses 100 are formed, etching prevention layer 80 covering pad 55 may be removed. In embodiments, a process of removing etching prevention layer 80 may be performed in a relatively short period of time to minimize or prevent defects in microlenses 100. After etching prevention layer 80 is removed from pad 55, a conductive wire may be wire-bonded to pad 55 to allow operation of image sensor 110.

In embodiments, oxidization of a pad of an image sensor may be minimized or prevented, thus reducing or minimizing bonding failure of a conductive wire coupled to an image sensor. By minimizing bonding failure, more dependable image sensors may be fabricated and/or result in a higher manufacturing yield, in accordance with embodiments.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
   forming a photodiode structure in a semiconductor substrate;
   forming a conductive pad over the semiconductor substrate adjacent to the photodiode structure;
   forming an etching prevention layer over the conductive pad;
   forming at least one of a color filter and a microlens over the photodiode structure; and
   removing the etching prevention layer from over the conductive pad after said forming at least one of the color filter and the microlens,
   wherein said forming the etching prevention layer is a selective formation process such that the etching prevention layer is substantially formed only over the conductive pad and substantially not over the passivation layer.

2. The method of claim 1, wherein the method is a method of forming a CMOS image sensor.

3. The method of claim 1, comprising:
   forming a passivation layer over the photodiode structure and the conductive pad prior to said forming the etching prevention layer, wherein said at least one of the color filter and the microlens are formed over the passivation layer;
   forming an opening in the passivation layer over the conductive pad to expose a surface of the conductive pad, wherein the etching prevention layer is formed through the opening.

4. The method of claim 1, wherein said selective formation process comprises using a material for the etching prevention layer that substantially adheres to the conductive pad and does not substantially adhere to the passivation layer.

5. The method of claim 4, wherein the material for the etching prevention layer comprises ruthenium.

6. The method of claim 4, wherein a material of the passivation layer comprises silicon oxide.

7. The method of claim 4, wherein a material of the conductive pad comprises aluminum.

8. The method of claim 1, wherein the etching prevention layer has a thickness in a range from approximately 50 Å to approximately 100 Å.

9. A method comprising:
   forming a photodiode structure in a semiconductor substrate;
   forming a conductive pad over the semiconductor substrate adjacent to the photodiode structure;
   forming an etching prevention layer over the conductive pad;
   forming at least one of a color filter and a microlens over the photodiode structure; and
   removing the etching prevention layer from over the conductive pad after said forming at least one of the color filter and the microlens,
   wherein said forming the etching prevention layer comprises atomic layer deposition.

10. The method of claim 9, wherein the atomic layer deposition is performed at a temperature ranging from approximately 150° C. to approximately 300° C.

* * * * *